(12) United States Patent
Trumbo et al.

(10) Patent No.: US 6,816,018 B1
(45) Date of Patent: Nov. 9, 2004

(54) SYSTEM AND METHOD FOR PARTITIONING A SYSTEM TIMING REFERENCE AMONG MULTIPLE CIRCUIT BOARDS

(75) Inventors: Bruce L. Trumbo, San Diego, CA (US); John C. LeVieux, Carlsbad, CA (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 10/198,902

(22) Filed: Jul. 19, 2002

(51) Int. Cl.[7] .................................................. H03L 7/00
(52) U.S. Cl. ....................................... 331/1 A; 375/375
(58) Field of Search ............................. 331/100, 1 A; 375/373, 374, 375, 376, 220, 327, 349, 350, 356, 358

(56) References Cited

U.S. PATENT DOCUMENTS

| | | | | |
|---|---|---|---|---|
| 4,641,146 A | * | 2/1987 | Gehman ..................... 343/814 |
| 4,890,305 A | * | 12/1989 | Devries ...................... 375/374 |
| 4,893,097 A | * | 1/1990 | Zwack ........................ 331/176 |
| 5,148,450 A | | 9/1992 | Hollyer ........................ 375/81 |
| 5,446,767 A | * | 8/1995 | Nakagawa et al. ......... 375/376 |
| 5,459,766 A | | 10/1995 | Huizer et al. ............... 375/376 |
| 5,488,641 A | | 1/1996 | Ozkan ......................... 375/374 |
| 5,515,403 A | | 5/1996 | Sloan et al. ................. 375/371 |
| 5,548,249 A | * | 8/1996 | Sumita et al. .............. 331/1 A |
| 5,790,608 A | * | 8/1998 | Benayoun et al. .......... 375/356 |
| 5,990,673 A | | 11/1999 | Forsberg ................... 324/76.62 |
| 5,999,025 A | | 12/1999 | New .......................... 327/156 |
| 6,078,595 A | | 6/2000 | Jones et al. .................. 370/503 |
| 6,091,932 A | * | 7/2000 | Langlais ...................... 725/111 |
| 6,166,572 A | | 12/2000 | Yamaoka ..................... 327/149 |
| 6,285,172 B1 | | 9/2001 | Torbey ........................ 323/237 |
| 6,470,032 B2 | | 10/2002 | Dudziak et al. ............. 370/503 |
| 6,539,799 B1 | * | 4/2003 | Handrich et al. ............. 73/493 |

* cited by examiner

*Primary Examiner*—Timothy P. Callahan
*Assistant Examiner*—Cassandra Cox
(74) *Attorney, Agent, or Firm*—McDonnell Boehnen Hulbert & Berghoff LLP

(57) ABSTRACT

In a phase-locked loop, multiple input clock references can each connect to a different interface card. Each interface card can include a phase comparator portion of a phase-locked loop. The phase comparators can produce a phase error signal for a phase-locked loop. One or more of the phase error signals can be transmitted across a bus, such as a time division multiplexed bus, to a system card. The system card can include a controlled oscillator portion of the phase-locked loop. The output of the system card can then sent back to one or more of the interface cards to complete the phase-locked loop.

18 Claims, 2 Drawing Sheets

SYSTEM AND METHOD FOR PARTITIONING A SYSTEM TIMING REFERENCE AMONG MULTIPLE CIRCUIT BOARDS

FIELD OF THE INVENTION

This invention generally relates to clock synchronization. More specifically, it relates to partitioning phase-locked loops.

BACKGROUND OF THE INVENTION

In data transmission, for example, two systems may communicate to exchange information. While data transmission may be performed using either analog or digital systems, digital systems are commonly employed in applications such as, computer systems, telecommunications systems and other systems. For digital systems, data is typically encoded into discrete values and may be transmitted using a variety of different protocols. The various transmission protocols can specify transmission characteristics, such as signaling methods, framing methods, data rates and other characteristics.

In order to properly send and receive signals, a transmitter and receiver should generally send and receive data at the same frequency. By using the same frequencies, the receiver can accurately align with the transmitter and read the incoming signal at the proper times. The frequency of operation, and thus the alignment of the transmitter and receiver, is generally controlled by a system timing reference, such as a clock.

If the clock frequencies of the transmitter and receiver are off, then gradually over time the receiver strays from reading the signal at the correct point. As the timing error between the devices grows, the receiver may begin to incorrectly read the incoming signals. This can cause an error in receiving the transmitted data and, therefore, is undesirable.

One way to closely align the clocks of two digital systems is for each system to use a clock at approximately the same frequency or at multiples of each other. This, however, is not always an adequate solution, because the oscillators used to produce the clocks cannot be manufactured to be exact multiples of each other. Since, this method cannot support continuous data transmission without errors, the transmitter and receiver must periodically stop exchanging data in order to realign their clocks. Also, highly accurate oscillators are expensive, and requiring each component to include its own highly accurate oscillator can significantly increase the system's cost.

A second way of matching two digital systems is for only one system to produce a clock and for that system to provide the other system with the clock, a process that is generally termed synchronous communication. Sharing a clock, however, may not precisely synchronize the two systems. When a signal is transmitted along a transmission medium, the signal can be affected by the medium's impedance. As the signal travels a longer distance, the transmission medium can have a greater affect on the resulting signal. Thus, the resulting signal changes from the original signal. Additionally, devices connected to the transmission mediums may also alter the signals traveling between the devices, and other signals traveling in proximity may produce interference that alters the shared signal. Therefore, the received clock signal from another system may not necessarily match the clock signal actually transmitted by the other system.

A third way of matching two digital systems is for both systems to produce a clock and for one system to synchronize its clock with the clock of the other system. One way to synchronize two clocks is by using a phase-locked loop ("PLL"). A PLL can be used to lock an outputted clock signal to the frequency of an inputted timing reference. To synchronize two systems, the clock in one system can be produced independently, and the clock in the other system can be produced using a PLL. The independent clock of the first system can be used as the timing reference inputted to the PLL. Alternatively, timing information extracted from a received data signal may be used as a timing reference. Then, the output of the PLL can be locked to the inputted timing reference.

In many systems it may be desirable to synchronize a PLL-generated clock to any one of multiple possible reference inputs from other sources. In one method of using multiple reference inputs, the reference inputs may connect to respective cards. Each respective card may include the complete PLL circuitry to produce a locked signal. The locked signal can then be provided to other devices for use as a timing reference. This implementation, however, can require additional and duplicated circuitry on each card. Also, including a VCO on each card can additionally increase the cost of the cards.

In another method of using multiple reference inputs, the reference inputs can each be provided to a different card. The cards can each include a phase comparator, and the output of the phase comparator of each card links over a dedicated connection to a common VCO. The use of dedicated connections requires additional circuitry within the system to support multiple reference inputs. It also requires advanced knowledge of the sources of the various timing references in order to provide all the necessary dedicated connections, and this does not allow for the design of the system to be easily changed. Further, since all the phase comparators connect to the VCO, one phase comparator must be selected for use with the VCO, and the other phase comparators must be disabled to prevent their output from interfering with the operation of the VCO.

Therefore, there exists a need for an improved method and system for handling multiple timing references in a phase-locked loop.

SUMMARY OF THE INVENTION

In a phase-locked loop, a reference signal can be provided to the phase comparator. The phase comparator can produce a phase error signal based on the reference signal and based on a feedback signal. Multiple cards may each include the phase comparator circuitry. One or more of the phase error signals produced by the device cards may be transmitted across a data link, such as a bus, to a controlled oscillator.

The controlled oscillator may use a received phase error signal to produce an output, and the output may oscillate at a multiple of the reference signal from one of the device cards. The output of the controlled oscillator may be provided to the device cards, such as for use as a timing signal. The output of the controlled oscillator may also be provided to the multiple device cards to be used as the feedback signal in their respective phase comparator circuitry.

These as well as other aspects and advantages of the present invention will become apparent from reading the following detailed description, with appropriate reference to the accompanying drawings.

BRIEF DESCRIPTION OF THE DRAWINGS

An exemplary embodiment of the present invention is described herein with reference to the drawings, in which.

DETAILED DESCRIPTION OF EXEMPLARY EMBODIMENTS

Figure 1:
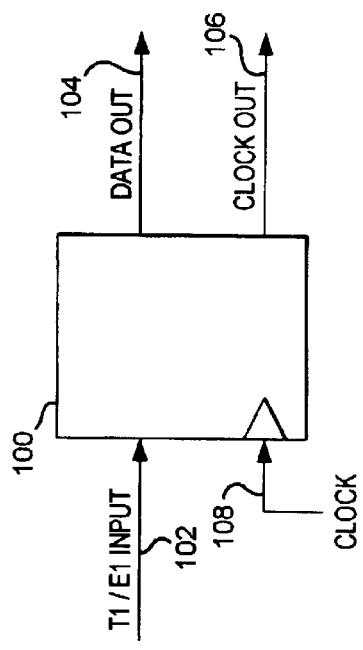
FIG. 1 is a block diagram of a module that extracts a clock signal from a data signal.

In many different types of systems it may be desirable to synchronize the operation of two or more components to a common timing reference. This may be done, for example, by using a phase-locked loop ("PLL"). A phase locked loop can be used to synchronize two signals. For example, the PLL receives as input a timing reference signal. The timing reference can be used as a clock signal in one device, and it can be provided to the PLL that can be used as a clock signal for another device. The PLL can lock an output signal to the same frequency as the inputted timing reference or a multiple of the frequency. Since the output of the PLL is locked to the timing reference, the timing reference and the output signal can both serve as synchronized clock signals.

Synchronization of timing references is commonly used in data communications. For example, in data communication systems, a transmitter and a receiver can exchange information. The transmitter can send information to the receiver at a specified rate. The receiver can then receive the information sent by the transmitter by reading data signals on a data link between the two devices. In order for the receiver to correctly read the incoming data, the transmitter and the receiver should generally align the data rates. For example, the receiver should generally read data at the same rate that the transmitter sends data. Or, the receiver may read data at a multiple of the rate at which the transmitter sends the data.

If the transmitter and the receiver, however, are not operating at the same frequency, or at multiple frequencies, the receiver may erroneously read data. For example, it may miss reading bits, or it may read certain bits more than one time, thereby creating an erroneously received signal. Synchronization between the transmitter and the receiver can help reduce data transmission errors caused by misalignment of their respective operating frequencies.

One common application for transmitters and receivers is telecommunications. In North America, telecommunications data is frequently carried using T1 lines. T1 generally refers to a specified industry standard for data communications, which is incorporated herein by reference. It supports 24 channels, and each channel can transmit eight bits per frame. A frame is 192 data bits plus an additional signaling bit, and it has a duration of 125 microseconds. Therefore, a T1 line operates at an overall data transmission rate of 1.544 Mbits per second. The European counterpart signaling format, E1, operates in a similar manner; however, it uses a different set of framing and signaling specifications, and it transmits data at a different rate.

Telecommunications systems can use a synchronized clock, and they generally employ two primary methods to provide timing reference signals. In one method the timing reference signal is sent separately from the data stream. This is typically used in circuitry in a central office. In another method, the timing reference signal is extracted from the data stream. The data stream can be a changing array of 1's and 0's, and the frequency at which the data changes is used to recover the timing reference signal. While this method for providing a timing reference signal may be used in many different environments, it is commonly employed in private branch exchanges ("PBXs") and other circuitry located remotely from the central office.

FIG. 1 shows a block diagram of a clock extraction module 100 that may be used to extract a timing reference signal, such as a clock signal, from a data stream. The module 100 includes a data stream input 102, which can be linked to a data stream. The data stream can be, for example, data carried on a T1/E1 telecommunications line. The module 100 extracts the clock signal from the data stream input 102, and the module 100 produces two output signals 104, 106. A clock input 108, which is commonly used in digital circuits, is used in operating the module 100.

The clock signal can be extracted from the data stream input 102 using many different conventional techniques, such as edge detection, phase-locked loops and other techniques. The methods of clock extraction that can be used in a system ordinarily varies with the different signaling methods used to carry the data stream.

In an exemplary embodiment, one output signal 106 is a Recovered T1/E1 Receive Clock, and the other output signal 104 is the data carried by the input signal. The module 100 may be implemented in many different ways, and its specific implementation will vary with the signaling and transmission methods used for carrying the data. The clock output 106 of the clock extraction module 100 is then provided to a PLL, which can be used to produce a signal that can be locked to the clock output signal 106.

Figure 2:
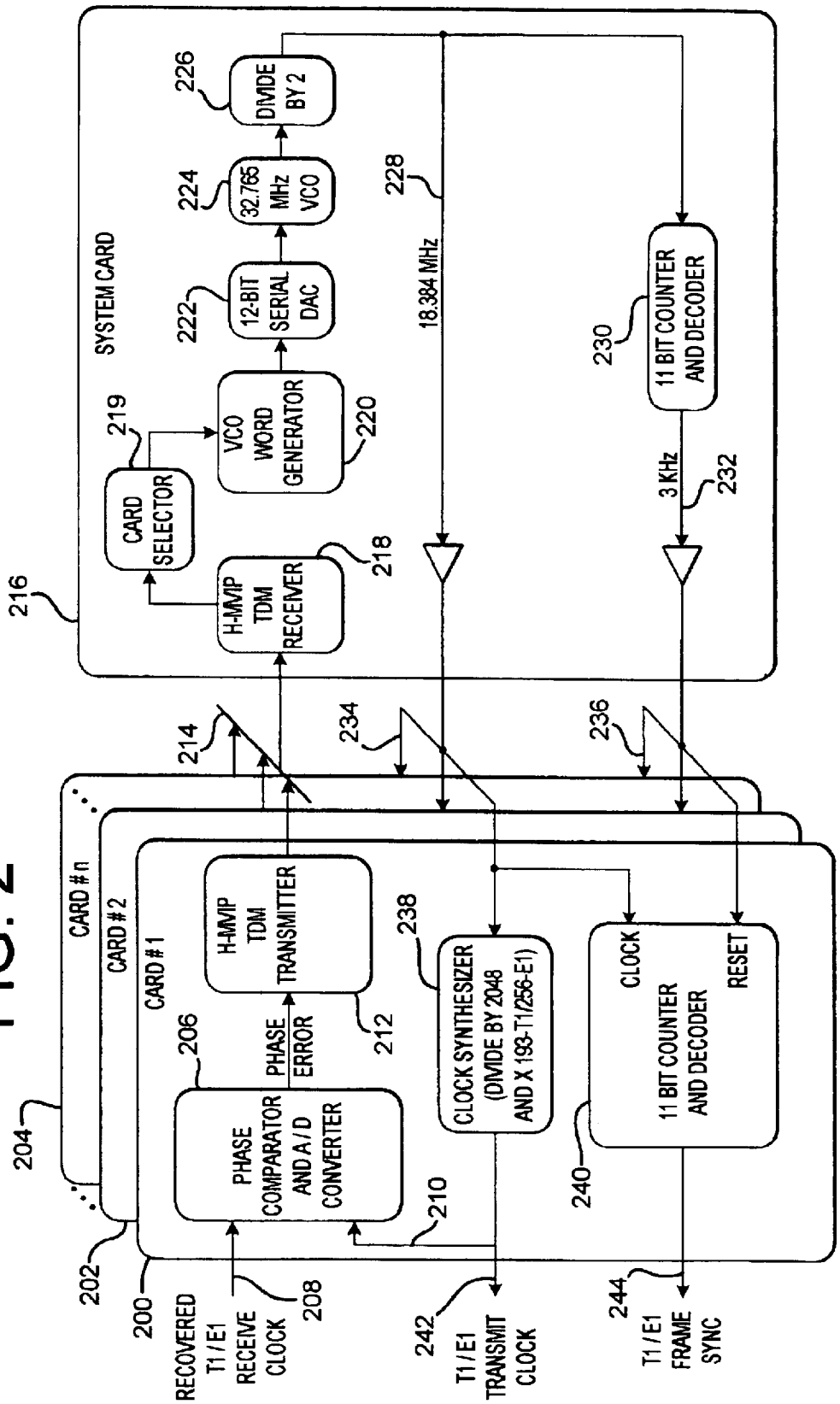
FIG. 2 is a depiction of a telecommunications system using a partitioned phase-locked loop.

FIG. 2 depicts an exemplary implementation of a partitioned phase-locked loop used in a telecommunications system. The system includes an array of cards 200, 202, 204. While FIG. 2 depicts three cards 200, 202, 204, the system may include a greater or fewer number of cards. The cards 200, 202, 204 can serve a variety of different functions. In one exemplary embodiment, they may be used to process calls carried on the T1/E1 lines and to redirect them along different lines for customer loops. Of course, this is merely one example, and the cards may be used for other purposes.

Each card in the array of cards 200, 202, 204 receives a clock signal 208. The clock signal 208 can be, for example, the Recovered T1/E1 Receive Clock from a T1/E1 line. The clock signal 208 can be provided, from example, by the clock output 106 of the clock extraction module. Each card 200, 202, 204 includes a phase comparator 206. The clock signal 208 can be used as input to the phase comparators on the different cards 200, 202, 204. Preferably, each card uses its own locally recovered clock signal from its timing recovery circuit 100. Additionally, each phase comparator has as input a feedback signal 210. The feedback signal 210, which will be discussed in more detail later, can be used by the phase comparator 206 to create a phase error signal.

In this exemplary embodiment, each card 200, 202, 204 can make a phase comparison. One of the phase comparisons could be selected for use in creating a phase-locked loop with components on the system card 216. Advantageously, this configuration allows the flexibility of locking an oscillator on the system card 216 to a reference provided by a number of different sources. This can be done, for example, without requiring that the entire, cost-bearing PLL circuitry appear on each card 200, 202, 204 receiving a reference signal. The configuration can also provide redundancy for the PLL reference signal. If one card fails, one of the other cards could be substituted without adversely affecting the PLL. Specifically, in the event of the failure of a card whose phase error measurement was being used to generate system timing signals for other cards, the system card need only switch to a new phase error measurement. In this way, the remaining cards would not be disrupted, since the system timing reference would simply switch to the new phase error measurement. Of course, it is also possible that only one or more of the cards 200, 202, 204 includes the phase comparator circuitry.

The phase comparator 206 compares the phase between the Recovered T1/E1 Receive Clock 208 and the feedback signal 210. Each input signal to the phase comparator 206 has a period and a phase. The period is generally the length of a cycle of the signal, while the phase marks the start of a cycle of the signal compared to a reference point.

Figure 3:
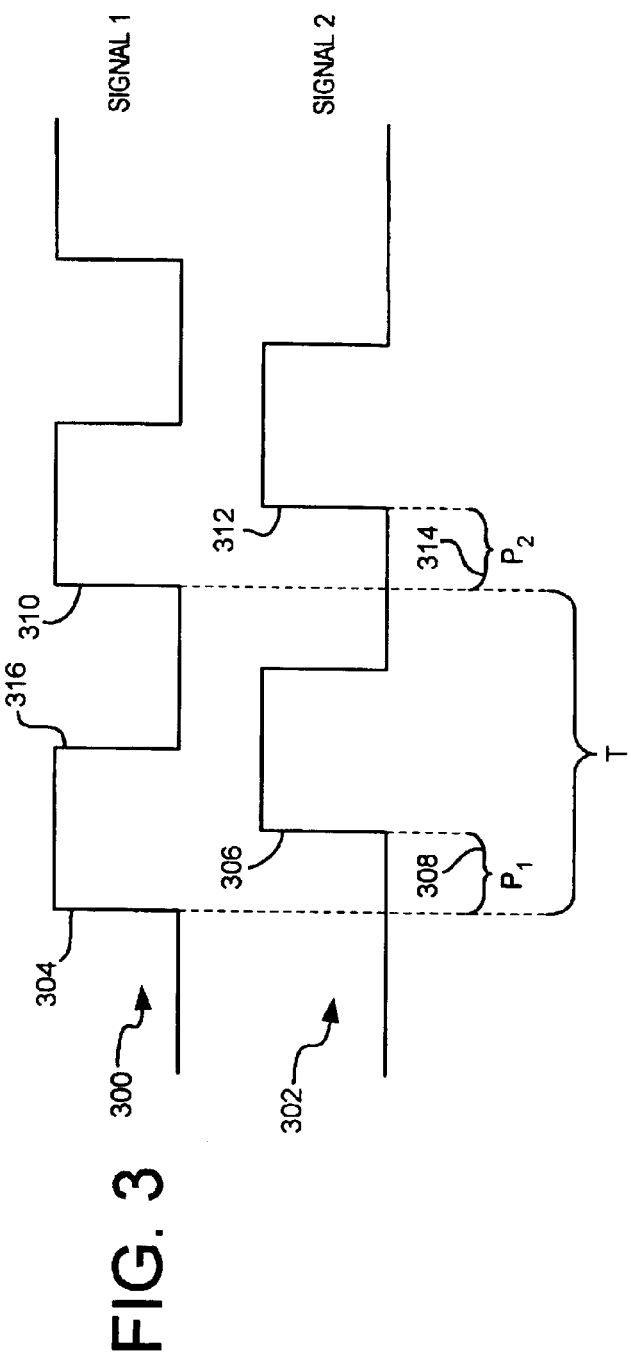
FIG. 3 is an illustration of phase differences between two signals.

FIG. 3 is an illustration of a difference in phase between two signals 300, 302. The phase reference point is the rising edge 304 of the first signal 300. This is compared to the rising edge 306 of the second signal 302. The difference in phase between the two signals 300, 302 is marked by $P_1$ 308. The phase difference between the two signals 300, 302 is mathematically measured in degrees, with the phase difference ranging from −180 degrees to 180 degrees. The phase offset is P/T*360(mod−180:180). The reference for the range of degrees is the period of the first signal 300. Where the rising edge 306 of the second signal 302 falls half way between the rising edge 304 of the first signal 300 and the rising edge 310, the second signal 302 is said to be 180 out of phase. If the rising edge 304 of the first signal 300 and the rising edge 306 of the second signal 302 occur at the same time, the signals 300, 302 are said to be in phase. Other differences are correspondingly measured in degrees.

FIG. 3 also illustrates a second measurement of the phase difference. At the second rising edge 310 of the first signal 300 the time until the next rising edge 312 of the second signal 302 is measured. This difference in time again represents difference in phase between the two signals 300, 302. Where both signals 300, 302 have the same frequency and period, the two phase difference measurements will be the same. However, if the signals 300, 302 have differing frequencies or periods, then the two phase measurements will be different. When this occurs, the signals 300, 302 will come in and out of phase based on time.

With continued reference to FIG. 2, the phase comparator 206 compares the phase between the Recovered T1/E1 Clock 208 and the feedback signal 210. The output of the phase comparator 206 is a phase error signal, which indicates a difference in phase between the two input signals. The phase error signal outputted by the phase comparator 206 can be an analog signal, or it can be a digital signal. Where the phase error signal is an analog signal, the phase comparator 206 might optionally include an analog to digital converter to convert the analog signal to a digital signal.

In one exemplary embodiment, the phase error signal may be a digital signal. For example, the phase comparator 206 may be a digital counter that counts the difference between a reference point on one of the input signals and a corresponding reference point on the other input signal. The output of the digital counter is digital, and therefore, the phase error signal would also be a digital signal.

For a digital phase comparator, the digital output can be encoded into a specified number of bits. For example, the phase comparator output may be represented by a 14-bit number, but other size outputs may also be used. In these cases, the maximum possible digital number may correspond to the maximum phase difference (e.g., 180 degrees), while the lowest possible digital number may correspond to the other polar phase difference (e.g., −180 degrees). Of course, other representations for the phase difference can also be used.

Once the phase comparator 206 produces the phase error signal, it is sent across a common data link to a system card 216. As depicted in FIG. 2, the phase error signal is sent across a bus 214 to the system card 216. The bus is a common data link shared by the cards 200, 202, 204. The bus can use a variety of different transmission schemes to send data from the cards 200, 202, 204 to the system card 216. For example, the bus may be an analog bus, and it may carry analog data. Alternatively, the bus may be a digital bus, and it may carry digital information.

The use of the bus 214 has several advantages over direct, wired connections between the phase comparators 206 and an oscillator. The bus 214 reduces the circuitry need to make the connections, thereby reducing the complexity of the system's design. Additionally, the use of the bus 214 allows for flexibility in the system's operation. Cards that include the phase comparator circuitry may be connected and disconnected from the bus 214 during operation of the system, and they may be moved to different locations within the system. Since the bus 214 connects the cards with the oscillator, it is not necessary that they be placed in a slot specifically designed to have a direct connection to the oscillator. This allows for flexibility in card installation.

In one exemplary embodiment, the bus 214 uses time division multiplexing ("TDM"). TDM is a transmission method where the data from one or more sources is interleaved in time. For example, in TDM each card 200, 202, 204 can be assigned one or more time slots in which to transmit data along the bus 214. During its timeslot, the card can transmit data along the bus 214. At the end of its timeslot, the card can stop transmitting, and the next card can use the bus 214. This process can continue through a predetermined number of assigned timeslots. Once the predetermined number of timeslots has been used, the first card again transmits data over the bus 214. The use of different timeslots can prevent the cards 200, 202, 204, from simultaneously attempting to transmit data on the bus 214 and thereby interfering with each other's communications.

Many different TDM implementations may be used to transmit data across the bus 214. In one exemplary embodiment, the data is transmitted across the bus 214 using H-MVIP. As is known in the art, H-MVIP is an industry standard for TDM data transmission. Existing telecommunications equipment often already supports data transmission using H-MVIP. Therefore, H-MVIP can be advantageously supported in many current systems without requiring additional circuitry. In an H-MVIP implementation, the phase error signal is sent from the phase comparator 206 to an H-MVIP TDM transmitter 212. The H-MVIP bus transmitter 212, or other suitable bus transmitter, appropriately formats the phase error signal and transmits it across the bus 214 to a system card 216. Of course H-MVIP is merely exemplary in nature, and other TDM methods may also be used to transmit data from the cards 200, 202, 204 across the bus 214.

In one exemplary embodiment, each of the cards 200, 202, 204 receives an input signal, such as the Recovered T1/E1 Receive Clock 208. These signals may be the same across all the cards 200, 202, 204, or they may be different. Further, each card 200, 202, 204 can perform a comparison between their respective input signals 208, 210. Since each card 200, 202, 204 can make a phase comparison between two input signals using the card's phase comparator 206, multiple phase error signals may be generated for transmission across the bus 214. In one embodiment, all the different phase error signals are transmitted across the bus 214 to the system card 216. A card selector 219 might then determine which of the different phase error signals to use. Other embodiments might position the card selector 219 at different locations or use other methods of selecting which signal to use. In an alternate embodiment, only signals from a subset of cards are transmitted across the bus 214. In one example of selecting phase error signals, the H-MVIP bus transmitters 212 select the specific phase error signals transmitted across the bus 214. In yet another example, additional circuitry selects one or more of the phase error signals from the cards 200, 202, 204, to be transmitted across the bus to the system card 216.

In another exemplary embodiment, the phase error signal may be filtered before it is transmitted across the bus 214. For example, the phase error signal may be an analog signal. It may be filtered to change the gain of the signal, to filter out various frequency ranges, or to otherwise alter the signal. In another example, the phase error signal may be a digital signal. The digital signal may be encoded, for example, by scaling the value of the signal. Of course, other filtering methods and encoding methods, such as FIR, IIR or others, may also be used.

The phase error signal may be encoded by a bus transmitter, for example, by the H-MVIP TDM bus transmitter 212. Alternatively, additional circuitry may be added to the cards 200, 202, 204 to encode the phase error signal prior to transmission over the bus 214. As the phase error signals may be encoded before they are transmitted over the bus 214, the bus would not necessarily carry the same phase error signals produced by the phase comparators 206. After the encoding, the bus 214 would carry a signal that represents the original phase error signal generated by the phase comparators 206.

An H-MVIP TDM bus receiver 218, or other suitable bus receiver, receives the phase error signals transmitted across the bus 214. Since the cards 200, 202, 204 can each transmit a phase error signal, the H-MVIP TDM bus receiver 218 may receive multiple phase error signals. The H-MVIP TDM bus receiver 218 may optionally select one of the phase error signals to be used in the phase-locked loop circuitry of the system card 216. In another embodiment, additional circuitry is used to select one of the multiple phase error signals received by the H-MVIP TDM bus receiver 218. The additional circuitry may be used in conjunction with H-MVIP TDM bus receiver 218, or it may be used in place of the H-MVIP TDM bus receiver 218. In another alternate embodiment, the cards 200, 202, 204 already have selected a single phase error signal to be transmitted across the bus 214. In that case, the H-MVIP TDM bus receiver 218 would only receive a single phase error signal and would not need to select among multiple phase error signals present on the bus.

In yet another embodiment, the H-MVIP bus receiver 218 may perform filtering of the received phase error signals. The filtering may, for example, change the gain of the phase error signal, or it may alter other properties of the signal. The filtering performed by the H-MVIP bus receiver 218 may be in addition to encoding that was performed on the phase error signal before it was sent across the bus 214, such as encoding that was performed by the H-MVIP bus transmitter 212 or by another element. While the H-MVIP bus receiver 218 may perform filtering on the received phase error signal, other circuitry may also be used to filter this received phase error signal. This filtering may be in addition to the filtering performed by the H-MVIP bus receiver 218 or it may be in place of filtering performed by the H-MVIP bus receiver 218.

The phase error signal is then sent from the H-MVIP bus receiver 218 to a VCO word generator 220. The VCO word generator 220 scales the phase error signal, thereby performing a type of decoding for a digital signal. The decoded output of the VCO word generator 220 is then be inputted into a 12-bit serial digital to analog converter ("DAC") 222. The 12-bit DAC 222 converts the digital representation of the phase error signal generated by the VCO word generator 220 into an analog signal. The 12-bit DAC 222 receives as input a digital word. The word can be inputted one bit at a time, and then the 12-bit DAC 222 can convert the digital word into an analog voltage.

In one exemplary operation, the maximum and minimum inputs to the DAC 222 are the maximum and minimum values represented by the 12-bit digital word. The output of the DAC 222 varies with the particular DAC utilized, but typically an input of $000_H$ (i.e., the minimum value represented by a 12-bit word) can correspond to an output of 0V, and an input of $FFF_H$ (i.e., the maximum value represented by a 12-bit word) can correspond to an output of 5V.

The 12-bit DAC 222 is merely exemplary in nature, and it is possible to use DACs other than the 12-bit DAC 222. For instance, it is possible to use an 8-bit or 16-bit DAC, or a DAC having a different number of input bits. In addition to varying the number of bits in the 12-bit DAC 222, it is also possible to use a parallel DAC. A parallel DAC also accepts a digital word and converts it to an analog voltage; however, instead of having one data bit input, like the serial DAC 222, the parallel DAC reads in all the bits of the digital word simultaneously. Its output also varies depending on the value of the inputted word.

As depicted in FIG. 2, the output of the 12-bit DAC is inputted into the 32.768 MHz VCO 224. The 32.768 MHz VCO 224 generally oscillates at 32.768 MHz, and it produces a steady clock output at that frequency. The input voltage of the VCO 224, however, may alter the frequency of its output. For example, a voltage of 0V may cause the output of the VCO 224 to oscillate at a frequency below 32.768 MHz, while a maximum input voltage of 5V may cause the VCO 224 to oscillate at a frequency above 32.768 MHz. Likewise, voltages of between 0V and 5V may cause a linear change in the output frequency from its lowest value below 32.768 MHz to its highest value above 32.768 MHz. The exact variation of the oscillator with respect to the input, however, will vary with the specific oscillator used.

While the 32.768 MHz VCO 224 can be a voltage controlled oscillator, other variations are possible. In another embodiment, a different type of controllable oscillator may be used. The controllable oscillator may change its output frequency based on the controllable input, and the controllable input may be something other than voltage. For example, the controllable oscillator may change its output based on the phase, frequency, current or other characteristics of an input. Of course, other variations are also possible.

The output of the VCO 224 can be a clock signal that can be locked to a multiple of the Recovered T1/E1 clock 208. For example, it may be locked to the frequency of the Recovered T1/E1 clock 208, it may be locked to an integer multiple of the Recovered T1/E1 clock 208, or it may be locked to some other multiple. The selected value of 32.768 MHz for the VCO 224 can correspond to the H-MVIP standard used for transmission of data across the bus 224; however, other values for the VCO may also be used 224. Different values may be chosen, for example, based on other standards used for transmission across the bus 214, based on other inputs signals to the cards 200, 202, 204, based on other signals used within the system, or based on a variety of other factors. It should be understood, though, that the 32.768 MHz value is merely exemplary in nature.

The locked output signal produced by the VCO 224 can be further divided for use within the system. For example, the locked output signal may be scaled down to provide a slower clock to other components within the system. Alternatively, the locked output signal may be scaled to produce higher multiples, or it may not be scaled at all. The locked output signal may also be scaled to produce more than one other signal.

As shown in FIG. 2, the 32.768 MHz VCO output goes through a divide-by-two element 226 to produce an approximately 16.384 MHz signal 228. The 16.384 MHz signal 228 is commonly used within the H-MVIP standard. The 16.384 MHz signal 228 is then provided back to the cards 200, 202, 204 for use as a timing reference. This may be done, for example, by transmitting the 16.384 MHz signal over a bus 234 connected to the cards 200, 202, 204.

Additionally, an 11-bit counter and decoder 230 scales down the output of the divide-by-two unit 226. The 11-bit counter and decoder 230 divides the 16.384 MHz signal into an approximately 8 kHz signal 232. The 8 kHz signal 232 is then used in conjunction with the 16.384 MHz signal for H-MVIP transmissions. The 16.384 MHz signal 228 is the transmission frequency for H-MVIP, while the 8 kHz signal 232 provides a TDM frame synchronization for the H-MVIP transmissions.

It should be understood, however, that creating the 16.384 MHz signal 228 and the 8 kHz signal 232 are merely exemplary in nature for the telecommunications system of FIG. 2. The output of the VCO 224 does not necessarily need to be scaled at all, or it may be scaled into other frequencies. As has been previously explained, the 16.384 MHz signal 228 and the 8 kHz signal 232 are used in H-MVIP transmissions. For systems using other transmission standards, the output of the VCO 224 may be scaled to different values. Additionally, changing the VCO oscillation frequency may also change the values of the scaled frequencies. In another embodiment, the VCO 224 output may be scaled to produce signals for other uses than transmission of signals across the bus 214. For example, the system card 216 may produce scaled signals that are used by other components on the system card 216 or by other components on the cards 200, 202, 204.

Returning to the exemplary implementation of FIG. 2, the two reduced frequency signals 228, 232 are sent over buses 234, 236 to the cards 200, 202, 204. For example, the 16.384 MHz signal 228 is sent over one bus 234 to the cards 200, 202, 204, while the 8 kHz signal 232 is sent over another bus 236 to the cards 200, 202, 204. Of course, the reduced frequency signals are produced for use in the H-MVIP transmission, and additional frequencies may also be produced for use in other components in the system. Alternate embodiments that do not use H-MVIP may produce different frequency signals, which can be transmitted to the cards 200, 202, 204.

Once the signals 228, 232 are received by the cards, 200, 202, 204, they may be further converted. For example, as shown in FIG. 2, a clock synthesizer 238 performs a divide by 2048 and a multiply by 193 operation on the 16.348 MHz signal 228. This produces a clock signal at a frequency for T1 transmission. In a system using E1 transmission lines, the clock synthesizer 238 performs a divide by 2048 and a multiply by 256 operation. The resulting signal 242 T1/E1 transmit signal, can then be used in transmitting signals back over the telecommunications network. The T1/E1 transmit signal 242 is also used as the feedback signal 210, which is an input to the phase comparator that completes the feedback loop for the PLL.

Additionally, an 11-bit counter and decoder 240 may be used to further step down the 8 kHz 232 signal in order to produce a T1/E1 frame synch 244. The T1/E1 frame synch 244 can be used in conjunction with the T1/E1 transmit clock 242 to send data over a T1/E1 transmission line. Of course, it should be understood that these created signals 242, 244 are merely exemplary in nature for the telecommunications system depicted in FIG. 2. They serve as exemplary uses of the signals produced by the system card 216. Alternatively, the cards 200, 202, 204, may produce other signals, or they may not produce these signals 242, 244.

FIG. 2 illustrates the division of a PLL in a specific telecommunications application; however, the telecommunications system is merely exemplary in nature. Other exemplary embodiments may use this configuration in a variety of different systems. For example, this configuration may be used in a computer system. One or more cards may be used to communicate with a central card. The central card may include an oscillator, and it may receive a phase error signal from one of the other cards. The timing reference generated by the central card may then be provided back to the other cards. It may also be provided to other cards or other elements.

In another example, this configuration may be used in another type of data transmission system. The system may send telecommunication data, network data, computer data or other types of data. Additionally, this configuration may be used in any other system using a PLL.

It should be understood that the programs, processes, methods and apparatus described herein are not related or limited to any particular type of computer or network apparatus (hardware or software), unless indicated otherwise. Various types of general purpose or specialized computer apparatus may be used with or perform operations in accordance with the teachings described herein. While various elements of the preferred embodiments have been described as being implemented in software, in other embodiments in hardware or firmware implementations may alternatively be used, and vice-versa.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more, fewer or other elements may be used in the block diagrams.

The claims should not be read as limited to the described order or elements unless stated to that effect. In addition, use of the term "means" in any claim is intended to invoke 35 U.S.C. §112, paragraph 6, and any claim without the word "means" is not so intended. Therefore, all embodiments that come within the scope and spirit of the following claims and equivalents thereto are claimed as the invention.

We claim:

1. A system for digitally encoding phase error information in a phase-locked loop, the system comprising:
    a phase comparator, wherein the phase comparator uses a first clock and a second clock as input, and wherein the phase comparator produces a digitally encoded phase error signal based on a difference in phase between the first clock and the second clock;
    a data link, wherein the phase error signal is digitally transmitted across the data link using TDM; and
    a controlled oscillator, wherein the controlled oscillator produces a third clock based on the phase error signal, wherein the third clock is a multiple of the second clock and wherein the second clock is derived from the third clock.

2. The system of claim 1, wherein the controlled oscillator is a voltage controlled oscillator.

3. The system of claim 1, wherein the data link is a bus.

4. The system of claim 1, wherein the phase comparator further comprises:

an analog to digital converter, wherein the phase comparator produces an analog phase error signal, wherein the analog to digital converter converts the phase error signal to a digital signal.

5. The system of claim 1, further comprising:

a scaler, wherein the scaler receives the phase error signal transmitted across the data link, and where the scaler produces a scaled output signal that is a function of the phase error signal.

6. The system of claim 5, further comprising:

a digital to analog converter, wherein the digital to analog converter converts the scaled output signal into an analog scaled signal, and wherein the analog scaled signal is inputted to the voltage controlled oscillator.

7. The system of claim 5 wherein the scaled output signal is a linear function of the phase error signal.

8. The system of claim 1, wherein the phase comparator produces a digital phase error signal.

9. The system of claim 1, wherein the phase comparator produces an analog phase error signal, and wherein the analog phase error signal is digitally transmitted across the data link.

10. The system of claim 1, wherein the phase error signal is transmitted across the data link using H-MVIP.

11. A system for partitioning a timing reference, the system comprising:

at least one interface card, wherein the at least one interface card receives a reference clock signal;

a phase comparator, wherein the phase comparator is located on the at least one interface card, and wherein the phase comparator performs a phase comparison between the reference clock signal and a synchronized clock, and wherein the phase comparator produces a phase error signal which represents the phase comparison;

a system card, wherein the system card is connected to the at least one phase interface card by a transmission medium;

a bus transmitter, wherein the transmitter receives the phase error signal from the phase comparator and digitally transmits the phase error signal across the transmission medium;

a bus receiver, wherein the receiver obtains the phase error signal from the transmission medium; and an oscillator, wherein the oscillator receives the phase error signal from the receiver, and wherein the oscillator produces the synchronized clock based on the phase error signal, and wherein the synchronized clock is transmitted to the phase comparator.

12. The system of claim 11, further comprising:

at least one clock frequency converter;

wherein the phase error signal is transmitted across the transmission medium using TDM; and wherein the at least one clock frequency converter creates a derived clock, wherein the derived clock is a multiple of the synchronized clock, and wherein the derived clock is used to transmit data across the transmission medium using TDM.

13. The system of claim 11, further comprising:

a card selector, wherein the at least one interface card includes a plurality of interface cards, and wherein the card selector chooses between the phase error signals of the plurality of interface cards and providing one of the phase error signals to the oscillator.

14. A method for digitally transmitting the phase error information in a phase-locked loop, comprising the steps of:

computing a phase difference between a reference signal and a feedback signal, where the feedback signal is based on a controlled oscillator output;

transmitting the phase difference across a transmission medium using TDM, wherein the transmission medium is a bus;

filtering the phase difference;

varying the controlled oscillator output based on the phase difference; and transmitting the controlled oscillator output to the phase comparator.

15. The method of claim 14 wherein the step of computing a phase difference produces a digital output.

16. The method of claim 14, further comprising the step of:

converting the phase difference into a digital signal, wherein this step is performed before the step of transmitting the phase difference across a transmission medium.

17. The method of claim 14, which further comprises the steps of:

synthesizing the controlled oscillator output to produce a multiple of the controlled oscillator output.

18. A method for digitally transmitting the phase error signal in a phase-locked loop, comprising the steps of:

computing a phase difference between a reference signal and a scaled voltage controlled oscillator output;

transmitting the phase difference digitally over a bus using TDM;

filtering the phase difference;

converting the phase difference to an analog signal;

driving a voltage controlled oscillator output using the phase difference;

divided a voltage controlled oscillator output to provide reference frequencies used for in TDM transmission;

transmitting the voltage controlled oscillator output over a bus;

frequency synthesizing the voltage controlled oscillator output to produce a plurality of other frequencies that correspond to signal used; and imputting one of the plurality of other frequencies into the phase comparator.

* * * * *